United States Patent
Hickman

(10) Patent No.: US 12,228,611 B2
(45) Date of Patent: Feb. 18, 2025

(54) SIGNAL PATH CALIBRATION OF A HARDWARE SETTING IN A TEST AND MEASUREMENT INSTRUMENT

(71) Applicant: Tektronix, Inc., Beaverton, OR (US)

(72) Inventor: Barton T. Hickman, Portland, OR (US)

(73) Assignee: Tektronix, Inc.

( * ) Notice: Subject to any disclaimer, the term of this patent is extended or adjusted under 35 U.S.C. 154(b) by 967 days.

(21) Appl. No.: 17/000,491

(22) Filed: Aug. 24, 2020

(65) Prior Publication Data

US 2021/0063488 A1 Mar. 4, 2021

Related U.S. Application Data

(60) Provisional application No. 62/892,812, filed on Aug. 28, 2019.

(51) Int. Cl.
*G01R 31/3183* (2006.01)
*G01K 3/00* (2006.01)
*G01K 3/08* (2006.01)
*G06F 11/30* (2006.01)

(52) U.S. Cl.
CPC ..... *G01R 31/318307* (2013.01); *G01K 3/005* (2013.01); *G01K 3/08* (2013.01)

(58) Field of Classification Search
CPC ............ G01R 31/318307; G01R 13/02; G01R 35/005; G01R 31/3191; G01K 3/005; G01K 3/08; G01K 3/10; G06F 11/0736; G06F 11/0751; G06F 11/0793; G06F 11/3013; G06F 11/3058; G06F 11/327
See application file for complete search history.

(56) References Cited

U.S. PATENT DOCUMENTS

| | | | | |
|---|---|---|---|---|
| 5,223,768 A | * | 6/1993 | Izawa | H04N 9/29 348/184 |
| 6,131,074 A | * | 10/2000 | Kawai | G01R 35/005 324/121 R |
| 6,661,900 B1 | * | 12/2003 | Allred | H03G 5/005 381/103 |
| 7,155,355 B2 | | 12/2006 | Pickerd | |

(Continued)

FOREIGN PATENT DOCUMENTS

| CN | 101960256 | 7/2015 |
|---|---|---|
| CN | 108627721 | 10/2018 |

(Continued)

*Primary Examiner* — Danny Chan
(74) *Attorney, Agent, or Firm* — Miller Nash LLP; Andrew J. Harrington

(57) ABSTRACT

A test and measurement instrument including a user interface configured to receive instructions to perform a signal path calibration for a user-specific setting from a user; a memory configured to store signal path calibration data; and one or more processors that can determine an actual signal path hardware setting for the user-specific setting, determine an adjustment to adjust the actual signal path hardware setting to the user-specific setting, adjust the actual signal path hardware setting by the adjustment to accurately represent the user-specific setting, and store the user-specific setting and the adjusted signal path hardware setting in the signal path calibration data.

19 Claims, 4 Drawing Sheets

(56) References Cited

U.S. PATENT DOCUMENTS

| | | | |
|---|---|---|---|
| 7,180,314 B1* | 2/2007 | Sekel | G01R 1/06788 |
| | | | 324/750.02 |
| 10,145,822 B2 | 12/2018 | Knierim et al. | |
| 2003/0112017 A1 | 6/2003 | McPherson et al. | |
| 2006/0031032 A1* | 2/2006 | Cohn | G01R 13/029 |
| | | | 702/69 |
| 2007/0290676 A1* | 12/2007 | Miller | G01R 31/2889 |
| | | | 324/149 |
| 2008/0263343 A1* | 10/2008 | Kassas | G06F 30/34 |
| | | | 713/1 |
| 2010/0134791 A1* | 6/2010 | Amblard | G01J 1/4257 |
| | | | 356/213 |
| 2011/0023578 A1 | 2/2011 | Grässer | |
| 2011/0074391 A1* | 3/2011 | Bartlett | G01R 1/06766 |
| | | | 324/76.44 |
| 2013/0180275 A1* | 7/2013 | Bonne | F25D 29/001 |
| | | | 62/118 |
| 2013/0231882 A1* | 9/2013 | Yu | G01R 13/0236 |
| | | | 702/67 |
| 2014/0215379 A1* | 7/2014 | Purdy | G06F 3/0481 |
| | | | 715/781 |
| 2015/0136971 A1* | 5/2015 | Green | H01J 49/0009 |
| | | | 250/281 |
| 2015/0171589 A1* | 6/2015 | Mende | G01R 1/071 |
| | | | 250/205 |
| 2015/0316607 A1* | 11/2015 | Iwasaki | G01R 31/2851 |
| | | | 324/750.01 |
| 2015/0356226 A1* | 12/2015 | Yang | G06F 1/26 |
| | | | 716/120 |
| 2017/0077613 A1* | 3/2017 | Banu | H04B 1/18 |
| 2017/0248631 A1* | 8/2017 | Mende | G01R 1/06766 |
| 2018/0278489 A1* | 9/2018 | Frackelton | H04L 43/50 |
| 2018/0328964 A1* | 11/2018 | Mende | G01R 1/06788 |
| 2021/0014701 A1* | 1/2021 | Bartko | H04B 17/102 |
| 2021/0063475 A1* | 3/2021 | Brush | G01R 13/0254 |

FOREIGN PATENT DOCUMENTS

| | | |
|---|---|---|
| JP | S63115067 | 5/1988 |
| JP | H11190765 | 7/1997 |
| JP | 3094528 U | 6/2003 |
| JP | 2004258031 | 9/2004 |
| JP | 2008267841 | 11/2008 |
| JP | 2010271173 | 12/2010 |
| JP | 2016031372 | 3/2016 |

* cited by examiner

SIGNAL PATH CALIBRATION OF A HARDWARE SETTING IN A TEST AND MEASUREMENT INSTRUMENT

PRIORITY

This disclosure claims benefit of U.S. Provisional Application No. 62/892,812, titled "POINT SIGNAL PATH CALIBRATION IN A TEST AND MEASUREMENT INSTRUMENT," filed on Aug. 28, 2019, which is incorporated herein by reference in its entirety.

TECHNICAL FIELD

This disclosure is directed to systems and methods related to test and measurement systems, and in particular, to signal path calibration in a test and measurement instrument.

BACKGROUND

Signal path calibration (SPC) in test and measurement instruments is a process that characterizes how hardware settings of the test and measurement instrument affect channel properties. Conventional signal path calibration in test and measurement instruments includes using a pre-determined collection of hardware or register settings to calibrate each channel. The test and measurement instrument will measure the signal path properties for each pre-determined hardware or register settings to characterize the channel at those settings. These settings and the characterization of the channel at these settings can be saved in a memory of the test and measurement instrument. However, the pre-determined collection of settings do not characterize every available combination of specific hardware settings. When a user selects a specific setting, the test and measurement instrument interpolates or extrapolates from the saved settings and characterizations to determine which settings to use to achieve the requested user setting.

Since a user will almost never choose a setting that exactly corresponds with a hardware setting that was directly characterized or calibrated, there will be some error in measurements caused by the interpolation. Further, in conventional test and measurement instruments, a signal path calibration can take an extended period of time, such as 30 minutes or more. Generally, as the input bandwidth of the test and measurement instrument increases, a larger amount of time is required to perform signal path calibration of the instrument. If a device under test and/or the test and measurement instrument has changed temperature, or if the test and measurement instrument has not been calibrated in a while, a user may not want to wait 30 or more minutes to run the calibration again, resulting in even more errors in measurements.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure allow for a user to perform signal path calibration for a single specific user-selected setting or a small set of specific user-selected settings. This can allow channel gain and offset accuracy to be significantly improved at the specific setting(s) selected and used by the user. Further, calibrations performed according to embodiments of the disclosure can run much more quickly than the conventional signal path calibration, such as within a few seconds compared to 30 minutes or more for the conventional SPC, so a user may be able to, and want to, perform the calibration more often. This capability may be particularly beneficial in situations with a device under test having a rapidly changing temperature, in particular in test environments such as a temperature cycling chamber in which the test and measurement instrument undergoes environmental temperature changes together with the device under test, since the temperature can affect how the hardware behaves in the test and measurement instrument.

Conventional signal path calibration includes characterizing how hardware settings, such as gain and offset registers, affect channel properties, which include, for example, the measured gain and offset of the channel. As discussed above, during conventional signal path calibration, the channel is characterized at a pre-determined collection of register settings. The pre-determined collection of register settings is pre-determined by the instrument manufacturer and is not changeable by the user. Then, in normal operation, when a user chooses a specific setting, the test and measurement instrument can interpolate or extrapolate from the characterized settings to determine a setting to use to achieve the requested user setting. The interpolation and extrapolation, however, can cause errors. Further, if the temperature of the test and measurement instrument has changed at all, the signal path calibration may be inaccurate. Embodiments of the disclosure, as discussed in more detail below, allow for signal path calibration to be performed at a single setting or a small set of specific settings. Performing signal path calibration at a single setting or a small set of specific settings may be referred to in this disclosure as "Point SPC."

Figure 1:
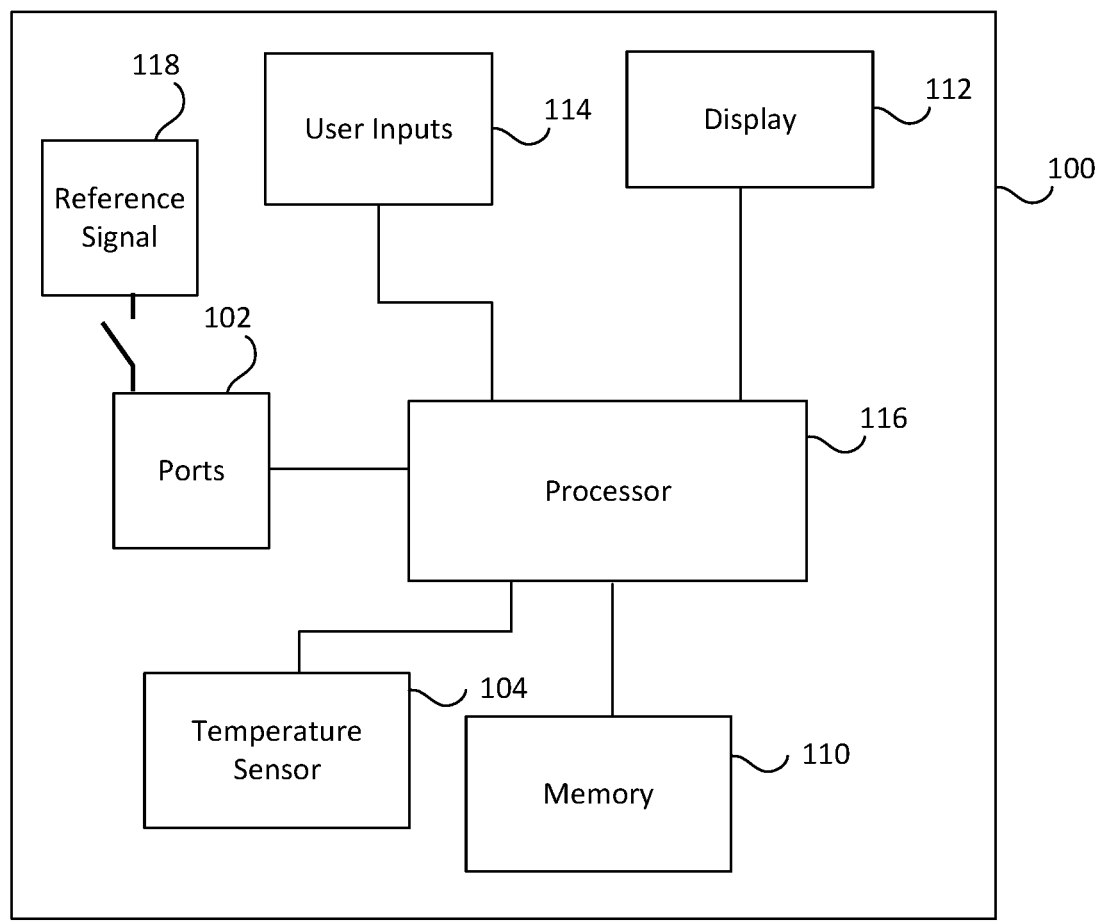
FIG. 1 is a block diagram of a test and measurement instrument according to embodiments of the disclosure.

FIG. 1 is a block diagram of an example test and measurement instrument 100, such as an oscilloscope, for implementing embodiments of the disclosure disclosed herein. The test and measurement instrument 100 includes one or more ports 102, which may also be referred to as a signal path, which may be any electrical signaling medium. Ports 102 may include a number of hardware components, such as, but not limited to receivers, transmitters, gain and offset registers, conditioning circuits, an analog to digital converter, and/or other circuitry to convert a received signal to a waveform for further analysis. Each port 102 is a channel of the test and measurement instrument 100. The ports 102 are coupled with one or more processors 116 to process the signals and/or waveforms received at the ports 102 from one or more devices under test. Although only one processor 116 is shown in FIG. 1 for ease of illustration, as will be understood by one skilled in the art, multiple processors 116 of varying types may be used in combination, rather than a single processor 116. The test and measurement instrument 100 may also include a temperature sensor 104, such as a thermometer, thermistor, thermocouple, etc., for determining an internal temperature of the test and measurement device 100. In some embodiments, the test and measurement instrument 100 may include multiple temperature sensors 104. Generally, the one or more temperature sensors 104 are located physically close to the hardware components in the signal path whose characteristics are most affected by changes in temperature.

The ports 102 can also be connected to a measurement unit in the test instrument 100, which is not depicted for ease of illustration. Such a measurement unit can include any component capable of measuring aspects (e.g., voltage, amperage, amplitude, etc.) of a signal received via ports 102. The resulting waveform can then be stored in the memory 110, as well as displayed on the display 112. The ports 102 may also be selectively connected to a reference signal source 118. The reference signal source 118 may be, for example, a signal generator providing a calibrated voltage reference signal. The reference signal 118 may be applied to the ports and used to characterize the channel properties during signal path calibration.

The one or more processors 116 may be configured to execute instructions from memory 110 and may perform any methods and/or associated steps indicated by such instructions, such as calibrating the ports 102. Memory 110 may be implemented as processor cache, random access memory (RAM), read only memory (ROM), solid state memory, hard disk drive(s), or any other memory type. Memory 110 acts as a medium for storing data, computer program products, and other instructions.

User inputs 114 are coupled to the one or more processors 116. User inputs 114 may include a keyboard, mouse, trackball, touchscreen, and/or any other controls employable by a user to interact with a GUI on the display 112. The display 112 may be a digital screen, a cathode ray tube based display, or any other monitor to display waveforms, measurements, and other data to a user. While the components of test instrument 100 are depicted as being integrated within test and measurement instrument 100, it will be appreciated by a person of ordinary skill in the art that any of these components can be external to test instrument 100 and can be coupled to test instrument 100 in any conventional manner (e.g., wired and/or wireless communication media and/or mechanisms). For example, in some embodiments, the display 112 may be remote from the test and measurement instrument 100.

Figure 2:
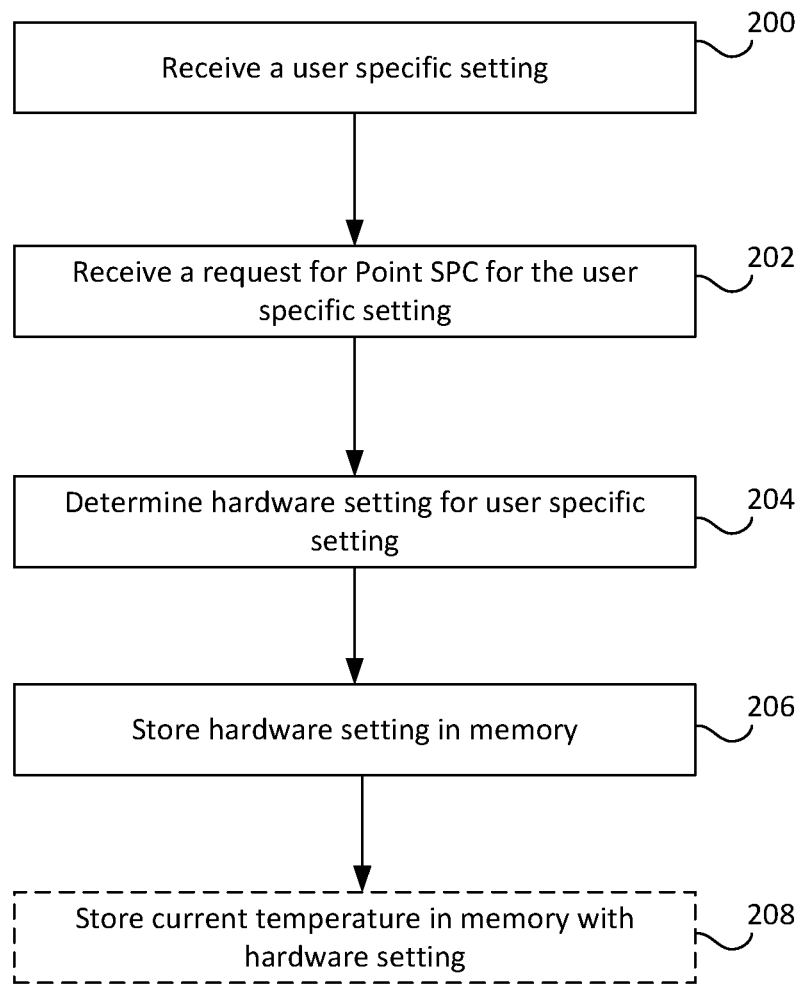
FIG. 2 is a flow chart illustrating an example operation for calibration a signal path based on a user specified setting according to embodiments of the disclosure.

FIG. 2 illustrates an example operation of the test and measurement instrument 100. In operation 200, a user sets the test and measurement instrument to a specific setting by the user inputs 114. The setting may be, for example, a vertical scale and an offset. Using the user inputs 114, the user can select to perform signal path calibration (SPC) for that particular specific setting in operation 202. This may be labeled, for example, as "Point SPC" on the test and measurement instrument 100 display 112 since the user is selecting a single point or setting to perform the SPC. In some embodiments, a small set of settings may be selected by a user, rather than a single point.

In some embodiments, a user may be testing a device using a number of different settings. Rather than individually performing Point SPC on each setting, a user may select a small set of settings through the user inputs 114 to perform Point SPC. The settings may be a number of different settings selected by a user, or the settings may include a range of settings selected by the user. In some embodiments, the user may input an acceptable calibration time through the user inputs 114. The user-acceptable calibration time (e.g., 10 seconds, 30 seconds, 1 minute, etc.) is longer than the time required for Point SPC for the user-specified setting (e.g., within a few seconds) and may be shorter than the time required for the conventional or full SPC (e.g., 30 minutes or more). Then, the processor 116 may modify the user-specified setting(s) to include additional settings to perform Point SPC for the group of modified settings. The processor 116 may determine the number of the additional settings based on the acceptable calibration time and the user-specific setting(s). These additional settings may be within the user-selected range or alternatively in the vicinity of the user-selected setting(s).

Determining the hardware settings for the user-specified setting can include determining the specific gain for the requested vertical scale, or include determining both the gain and the offset. In some embodiments, if only the vertical scale is calibrated, an offset control can be characterized respective to the gain setting for the vertical scale. This can allow the Point SPC to apply for the vertical scale regardless of the offset set by the user. For example, if the vertical scale is set to 50 mV/div, the hardware settings can be characterized for this particular gain, as well as characterizing how the gain and offset interact, and it would apply any time 50 mV/div is used, regardless of the offset setting.

In other embodiments, Point SPC can be performed for the exact gain and offset setting. This may be more limiting to a user, as it would require the test and measurement instrument be set to the specific vertical scale and offset, such as, for example, 50 mV/div and 500 mV offset for the Point SPC setting to apply. If a user sets the test and measurement instrument to 50 mV/div and a different offset, such as 100 mV offset, the Point SPC setting would not apply and either an interpolated hardware setting would be used, based on a conventional SPC, or a new Point SPC would need to be performed at this new offset.

To determine the hardware setting for the user-specific setting in operation 204, the processor 116 can first characterize the current hardware setting. The processor 116 can characterize the current hardware setting by employing the reference signal 118. For example, if a user had selected a vertical scale of 50 mV/div, and selects to perform Point SPC by the user inputs 114, the processor 116 may apply a calibrated voltage reference signal 118 to the port 102 being characterized, and determine that the current hardware settings result in an actual gain of 50.5 mV/div.

The processor 116 can then determine what adjustment or actual setting is needed for the gain register to achieve the gain set by the user. In some embodiments, the processor 116 may have information stored in the memory 110 about the slope of the hardware gain control, which can be determined from a conventional SPC performed. Based on the known slope, the processor 116 can adjust the gain by an amount dictated by the slope of the hardware gain control. In operation 206, the precise hardware setting can then be stored in a calibration table.

In other embodiments, the processor 116 may instead adjust the amount of gain as determined based on the slope of the hardware gain control, and then re-measure the characteristic of the hardware settings to confirm the actual user specified setting has been achieved. If not, the processor 116 can continue iterating until a desired accuracy is achieved. Alternatively, rather than using a known value, such as the slope of the hardware gain control, the processor

116 may estimate how much to adjust the gain, based on how far off the hardware settings currently are. The processor 116 may then continue iterating until a desired accuracy is achieved.

The offset can also be characterized using the same type of operation. That is, the current hardware settings can be characterized and the offset can be adjusted either by using a known slope of the hardware offset control or by estimating an amount for the adjustment. The processor 116 can then iteratively measure and adjust the hardware settings until the channel is set with a desired accuracy. Although the discussion above uses the example of characterizing vertical gain and/or offset, embodiments of the disclosure are not limited merely to characterizing channel properties for gain and offset settings. Rather, embodiments of the disclosure include using Point SPC to characterize any of a wide variety of channel properties such as timing alignment, interleave alignment, distortion correction, frequency response correction, and many other properties.

Once the adjustment and hardware setting have been determined, the hardware setting and/or the adjustment may be stored in memory 110 in operation 206. Memory 110 may store a signal path calibration table. The processor 116 may instruct the memory 110 to store the specific hardware setting for the user-specific setting in the signal path calibration table. Accordingly, if a user selects this setting again for a measurement, the processor 116 may directly pull the hardware setting and/or adjustment from the signal path calibration table in the memory 116. In some embodiments, the processor 116 may instruct the display 112 to indicate that the point SPC value is stored in memory and used for this setting to alert a user to the enhanced accuracy of this setting. In some embodiments, the processor 116 may store the specific hardware setting in the memory 110. In other embodiments, the memory 110 may store an adjustment value for the hardware setting. In still other embodiments, the memory 110 may store an adjustment factor, such as a scale factor, to the hardware setting. Some embodiments may store combinations of specific hardware settings, adjustment values, and adjustment factors in the memory 110, which may each be referred to in this disclosure as an "adjusted signal path hardware setting."

In some embodiments, the processor 116 may instruct the display 112 to display the calibration table memory. This can allow a user to see which specific settings have been calibrated and which settings are determined by interpolation or extrapolation. A user may also be able to select one or more specific settings in the calibration table memory by the user input 114 and instruct the processor 116 to perform Point SPC for the selected settings. A user may also delete settings from the calibration table stored in the memory 110 if the data is no longer needed.

In some embodiments, the processor 116 may register a temperature of the test and measurement instrument when Point SPC is performed, shown as optional operation 208 in FIG. 2. The hardware setting stored in the memory may then be stamped or stored with the temperature that the test and measurement instrument 100 is at during the calibration of the signal path at that setting. That is, Point SPC may be performed for a given setting at a particular temperature. In such embodiments, the Point SPC would only be applied when at the given setting and temperature, plus or minus a set threshold.

In some embodiments, when a user performs Point SPC for a given setting, the test and measurement instrument 100 by the processor 116 may automatically periodically repeat Point SPC whenever that setting is selected or whenever the test and measurement temperature has increased or decreased beyond a threshold. For example, if an internal temperature sensor on the test and measurement instrument 100 indicates that the temperature has changed by 10 degrees, the test and measurement instrument 100 may automatically perform Point SPC again. Embodiments of the disclosure, however, are not limited to a threshold of 10 degrees and any threshold may be set. The threshold may be predetermined and stored in the memory 110 or the threshold may be set by a user by the user inputs 114.

Figure 3:
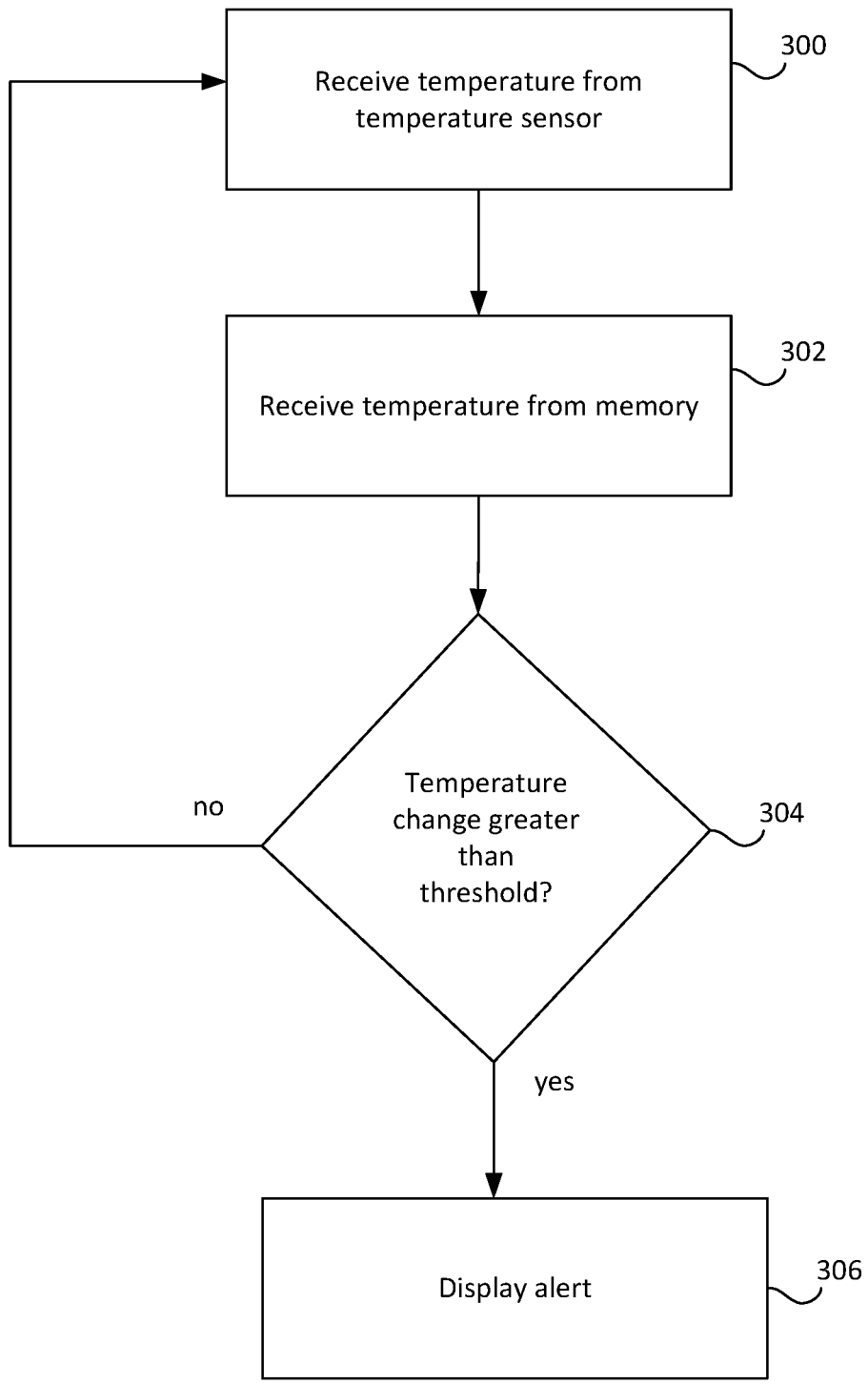
FIG. 3 is a flow chart illustrating an example operation for alerting a user if a temperature change has occurred in the test and measurement instrument according to embodiments of the disclosure.

FIG. 3 illustrates an example operation for alerting a user that a temperature in the test and measurement instrument 100 has changed from when Point SPC was last performed. In operation 300, the temperature of the test and measurement instrument 100 is received from the temperature sensor 104. In operation 302, the processor 116 determines the temperature that was stamped or saved with the Point SPC setting in the memory 110.

In operation 304, the processor 116 determines whether the temperature has changed more than a predetermined threshold for a given point SPC setting. That is, the processor 116 determines whether temperature has increased or decreased beyond a threshold. In other words, the processor 116 determines whether the change in temperature is greater than a threshold. If yes, then the processor 116 can display an alert to the user on the display 112 to inform the user in operation 306. If no, then the processor 116 returns to operation 300 to monitor the temperature.

Although not shown in FIG. 3, in some embodiments, the processor 116 may automatically repeat Point SPC if the temperature has changed beyond a threshold, as mentioned above. This may either be alerted to the user, such as in operation 306, or this may be performed in the background of the test and measurement instrument 100. In some embodiments, a user may determine whether to automatically repeat Point SPC if a temperature change has occurred or whether to just receive the alert.

Figure 4:
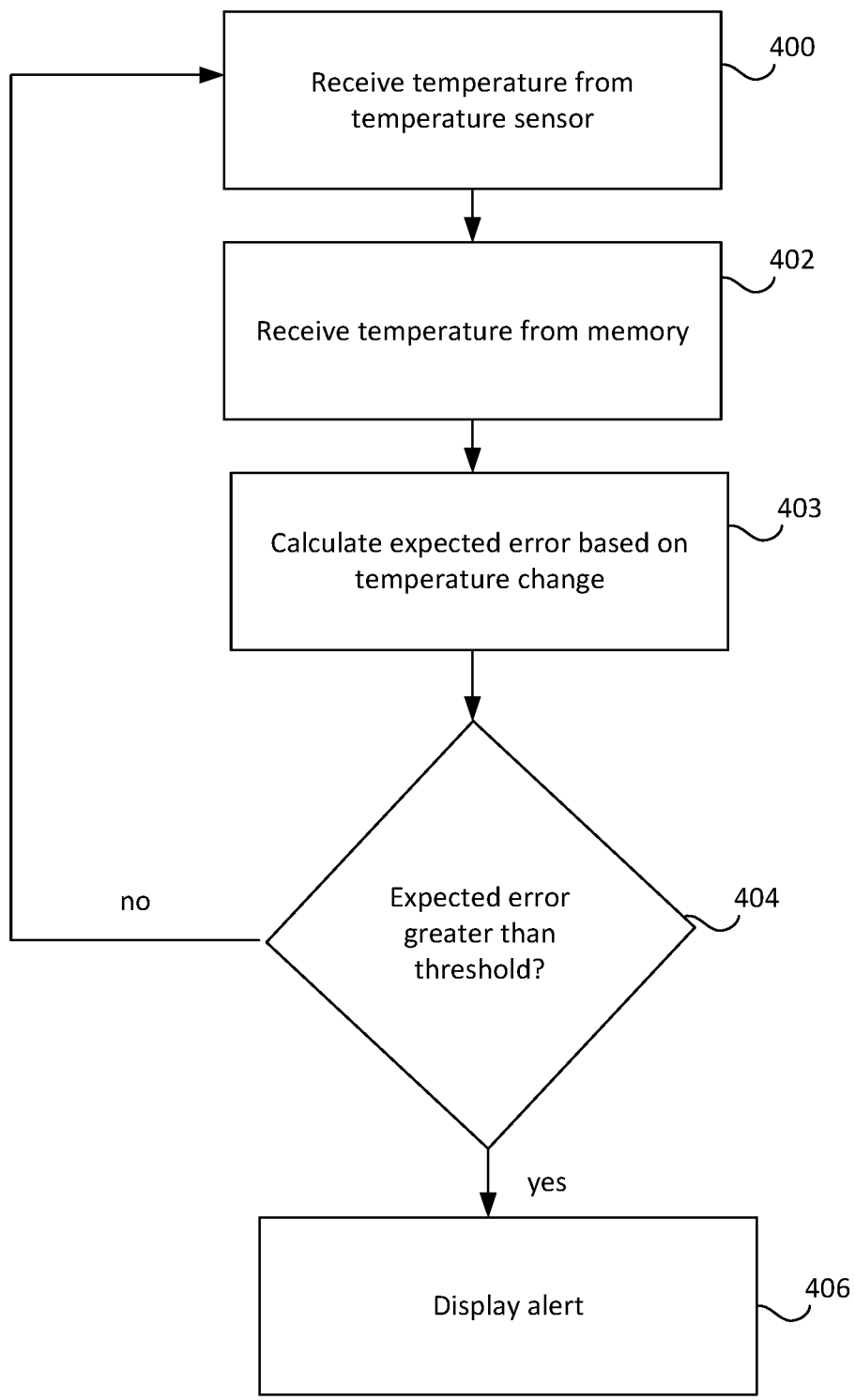
FIG. 4 is a flow chart illustrating an example operation for alerting a user if a temperature change has occurred in the test and measurement instrument that causes an expected error to be greater than a threshold according to embodiments of the disclosure.

FIG. 4 illustrates an alternative example operation for alerting a user and/or automatically repeating Point SPC based on a measured temperature. In FIG. 4, operations 400 and 402 are similar to operations 300 and 302 in FIG. 3, and will not be discussed further. In operation 403, the processor 116 calculates the expected error that will be caused by the change in temperature. The processor 116 can calculate the expected error, e.g. gain error, that will be caused by the change in temperature by using the known temperature performance data and characteristics of the components in the signal path. Then, in operation 404, the processor 116 determines whether the expected error is greater than a threshold. In some embodiments the threshold may be user-configurable. If no, the processor 116 returns to operation 400. If yes, then in operation 406 the processor can display an alert to a user and/or optionally automatically repeat Point SPC, as discussed above for operation 306. Thus, in the embodiment of FIG. 4, alerting a user and/or automatically repeating Point SPC is based on the expected error in a measured signal caused by a temperature change, not merely on a set temperature change threshold.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument, comprising a user interface configured to receive instructions to perform a signal path calibration for a user-specific setting received from a user; a memory configured to store signal path calibration data; and one or more processors configured to determine an actual signal path hardware setting for the user-specific setting, determine an adjustment to adjust the actual signal path hardware setting to accurately represent the user-specific setting, adjust the actual signal path hardware setting by the adjustment, and store the user-specific setting and the adjusted signal path hardware setting in the signal path calibration data.

Example 2 is the test and measurement instrument of example 1, wherein the actual signal path hardware setting includes a gain register and the adjustment includes a gain adjustment for the gain register.

Example 3 is the test and measurement instrument of either one of examples 1 or 2, wherein the actual signal path hardware setting includes an offset register and the adjustment includes an offset adjustment for the offset register.

Example 4 is the test and measurement instrument of any one of examples 1-3, further comprising a temperature sensor to determine a temperature of the test and measurement instrument, wherein the one or more processors are further configured to store the temperature when storing the user-specific setting and the adjusted signal path hardware setting in the signal path calibration data.

Example 5 is the test and measurement instrument of example 4, wherein the temperature is a first temperature, and, after storing the user-specific setting and the adjusted signal path hardware setting in the signal path calibration data, the one or more processors are further configured to: determine a second temperature of the test and measurement instrument, determine whether a difference between the first temperature and the second temperature is greater than a threshold, and display on a display an alert when the difference between the first temperature and the second temperature is greater than the threshold.

Example 6 is the test and measurement of example 4, wherein the temperature is a first temperature, and, after storing the user-specific setting and the adjusted signal path hardware setting in the signal path calibration data, the one or more processors are further configured to: determine a second temperature of the test and measurement instrument, determine whether a difference between the first temperature and the second temperature is greater than a threshold, and if the difference is greater than the threshold: determine a current hardware setting, determine a second adjustment to the current hardware setting if the current hardware setting no longer corresponds to the user-specific setting at a predetermined accuracy, adjust the current hardware setting by the second adjustment to accurately represent the user-specific setting, and store the user-specific setting, the newly adjusted signal path hardware setting, and the second temperature in the signal path calibration data.

Example 7 is the test and measurement instrument of any one of examples 1-6, wherein signal path calibration data includes a table stored in the memory including each setting that has been calibrated.

Example 8 is the test and measurement instrument of example 7, wherein a user may select a setting in the table to update a signal path calibration.

Example 9 is the test and measurement instrument of any one of examples 1-8, wherein the user-specific setting includes more than one setting.

Example 10 is the test and measurement instrument of any one of examples 1-9, wherein the user-specific setting includes a range of settings.

Example 11 is a method for performing signal path calibration for a user specified setting, comprising receiving the user specified setting at a user input; determining an actual signal path hardware setting for the user-specific setting; determining an adjustment to set the actual signal path hardware setting to the user-specific setting; adjusting the actual signal path hardware setting by the adjustment to accurately achieve the user-specific setting; and storing the user-specific setting and the adjusted signal path hardware setting in signal path calibration data in a memory.

Example 12 is the method of example 11, wherein the actual signal path hardware setting includes a gain register and the adjustment includes a gain adjustment for the gain register.

Example 13 is the method of either one of examples 10 or 11, wherein the actual signal path hardware setting includes an offset register and the adjustment includes an offset adjustment for the offset register.

Example 14 is the method of any one of examples 11-13, further comprising measuring a temperature of the test and measurement instrument and storing the temperature when storing the user-specific setting and the adjusted signal path hardware setting in the signal path calibration data.

Example 15 is the method of any one of examples 11-14, wherein signal path calibration data includes a table stored in the memory including each setting that has been calibrated.

Example 16 is the method of any one of examples 11-15, wherein the user-specific setting includes more than one setting.

Example 17 is the method of any one of examples 11-16, wherein the user-specific setting includes a range of settings.

Example 18 is one or more non-transitory computer-readable storage media comprising instructions, which, when executed by one or more processors of a test and measurement instrument, cause the test and measurement instrument to determine an actual signal path hardware setting for a signal path for a user-specific setting; determine an adjustment to set the actual signal path hardware setting to the user-specific setting; adjust the actual signal path hardware setting by the adjustment to accurately represent the user-specific setting.

Example 19 is the one or more non-transitory computer-readable storage media of example 18, further comprising instruction to cause the test and measurement instrument to determine whether the adjusted signal path hardware setting accurately represents the user-specific setting and when the adjusted signal path hardware setting does not accurately represent the user-specific setting, adjusting the adjusted signal path hardware setting by another adjustment to accurately represent the user-specific setting.

Example 20 is the one or more non-transitory computer-readable storage media of either one of examples 18 or 19, further comprising instructions to cause the test and measurement instrument to store the user-specific setting and the adjusted signal path hardware setting in signal path calibration data in a memory.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement instrument, comprising:
   a user interface configured to receive instructions to perform a signal path calibration for a user-specific setting received from a user, the signal path calibration to characterize how hardware settings affect a channel used as the signal path prior to the channel being used for measurements;
   a memory configured to store signal path calibration data; and
   one or more processors configured to:
      determine an actual signal path hardware setting for the user-specific setting for the channel by characterizing the channel;
      determine an adjustment to adjust the actual signal path hardware setting for the channel to accurately represent the user-specific setting based upon the characterization,
      adjust the actual signal path hardware setting by the adjustment, and
      store the user-specific setting and the adjusted signal path hardware setting in the signal path calibration data.

2. The test and measurement instrument of claim 1, wherein the actual signal path hardware setting includes a gain register and the adjustment includes a gain adjustment for the gain register.

3. The test and measurement instrument of claim 1, wherein the actual signal path hardware setting includes an offset register and the adjustment includes an offset adjustment for the offset register.

4. The test and measurement instrument of claim 1, further comprising a temperature sensor to determine a temperature of the test and measurement instrument, wherein the one or more processors are further configured to store the temperature when storing the user-specific setting and the adjusted signal path hardware setting in the signal path calibration data.

5. The test and measurement instrument of claim 4, wherein the temperature is a first temperature, and, after storing the user-specific setting and the adjusted signal path hardware setting in the signal path calibration data, the one or more processors are further configured to:
   determine a second temperature of the test and measurement instrument,
   determine whether a difference between the first temperature and the second temperature is greater than a threshold, and
   display on a display an alert when the difference between the first temperature and the second temperature is greater than the threshold.

6. The test and measurement of claim 4, wherein the temperature is a first temperature, and, after storing the user-specific setting and the adjusted signal path hardware setting in the signal path calibration data, the one or more processors are further configured to:
   determine a second temperature of the test and measurement instrument,
   determine whether a difference between the first temperature and the second temperature is greater than a threshold, and if the difference is greater than the threshold:
  determine a current hardware setting,
    determine a second adjustment to the current hardware setting if the current hardware setting no longer corresponds to the user-specific setting at a predetermined accuracy,
    adjust the current hardware setting by the second adjustment to accurately represent the user-specific setting, and
    store the user-specific setting, the newly adjusted signal path hardware setting, and the second temperature in the signal path calibration data.

7. The test and measurement instrument of claim 1, wherein signal path calibration data includes a table stored in the memory including each setting that has been calibrated.

8. The test and measurement instrument of claim 7, wherein a user may select a setting in the table to update a signal path calibration.

9. The test and measurement instrument of claim 1, wherein the user-specific setting includes more than one setting.

10. The test and measurement instrument of claim 1, wherein the user-specific setting includes a range of settings.

11. A method for performing signal path calibration for a user-specified setting, comprising:
  receiving the user-specified setting for a channel of a test and measurement instrument at a user input;
  determining an actual signal path hardware setting for the user-specific setting by characterizing the actual signal path hardware setting, the actual signal path hardware setting affecting the channel of a test and measurement instrument used as the signal path;
  determining an adjustment to set the actual signal path hardware setting to the user-specific setting based upon the characterization;
  adjusting the actual signal path hardware setting by the adjustment to accurately achieve the user-specific setting prior to the channel being used to take a measurement; and
  storing the user-specific setting and the adjusted signal path hardware setting in signal path calibration data in a memory.

12. The method of claim 11, wherein the actual signal path hardware setting includes a gain register and the adjustment includes a gain adjustment for the gain register.

13. The method of claim 11, wherein the actual signal path hardware setting includes an offset register and the adjustment includes an offset adjustment for the offset register.

14. The method of claim 11, further comprising measuring a temperature of the test and measurement instrument and storing the temperature when storing the user-specific setting and the adjusted signal path hardware setting in the signal path calibration data.

15. The method of claim 11, wherein signal path calibration data includes a table stored in the memory including each setting that has been calibrated.

16. The method of claim 11, wherein the user-specific setting includes more than one setting.

17. The method of claim 11, wherein the user-specific setting includes a range of settings.

18. One or more non-transitory computer-readable storage media comprising instructions, which, when executed by one or more processors of a test and measurement instrument, cause the test and measurement instrument to:
  determine an actual signal path hardware setting for a signal path for a user-specific setting by characterizing the actual signal path hardware setting, the actual signal path hardware setting affecting a channel of a test and measurement instrument used as the signal path;
  determine an adjustment to set the actual signal path hardware setting to the user-specific setting;
  adjust the actual signal path hardware setting by the adjustment to accurately represent the user-specific setting prior to the channel being used to take a measurement; and
  store the user-specific setting and the adjusted signal path hardware setting as signal path calibration data in a memory.

19. The one or more non-transitory computer-readable storage media of claim 18, further comprising instructions to cause the test and measurement instrument to determine whether the adjusted signal path hardware setting accurately represents the user-specific setting, and, when the adjusted signal path hardware setting does not accurately represent the user-specific setting, adjusting the adjusted signal path hardware setting by another adjustment to accurately represent the user-specific setting.

* * * * *